United States Patent
Takahashi et al.

(10) Patent No.: US 8,391,046 B2
(45) Date of Patent: *Mar. 5, 2013

(54) MEMORY CELL ARRAY

(75) Inventors: Tsuyoshi Takahashi, Tsukuba (JP); Shigeo Furuta, Tsukuba (JP); Yuichiro Masuda, Tsukuba (JP); Masatoshi Ono, Tsukuba (JP)

(73) Assignees: Funai Electric Advanced Applied Technology Research Institute Inc., Daito-shi (JP); Funai Electric Co., Ltd., Daito-shi (JP)

( * ) Notice: Subject to any disclaimer, the term of this patent is extended or adjusted under 35 U.S.C. 154(b) by 516 days.

This patent is subject to a terminal disclaimer.

(21) Appl. No.: 12/644,628

(22) Filed: Dec. 22, 2009

(65) Prior Publication Data

US 2010/0165694 A1 Jul. 1, 2010

(30) Foreign Application Priority Data

Dec. 26, 2008 (JP) ................................. 2008-334122

(51) Int. Cl.
*G11C 11/00* (2006.01)
(52) U.S. Cl. .................. 365/148; 365/158; 365/163
(58) Field of Classification Search .............. 365/63, 365/148, 158
See application file for complete search history.

(56) References Cited

U.S. PATENT DOCUMENTS

| 2004/0120185 A1* | 6/2004 | Kang et al. .......... 365/158 |
| 2008/0049487 A1* | 2/2008 | Yoshimura et al. .......... 365/148 |
| 2009/0201716 A1* | 8/2009 | Ufert .......... 365/148 |
| 2009/0256130 A1* | 10/2009 | Schricker .......... 257/4 |
| 2010/0165695 A1* | 7/2010 | Takahashi et al. .......... 365/63 |

FOREIGN PATENT DOCUMENTS

| JP | 2000-289358 A | 9/2000 |
| JP | 2006-79335 A | 3/2005 |
| JP | 2008-243988 A | 10/2008 |

* cited by examiner

*Primary Examiner* — Anthan Tran
(74) *Attorney, Agent, or Firm* — Crowell & Moring LLP

(57) ABSTRACT

Disclosed is a memory cell array including: word lines and first and second bit lines respectively connected to memory cells, wherein each memory cell includes a MOS transistor and a switching element formed inside a contact hole, the switching element includes first and second conductive layers and a gap in which a resistance value is changed by applying a predetermined voltage, each word line is connected to a gate electrode, each first bit line is connected to a second electrode, each second bit line is connected to the second conductive layer, and data is written by supplying a write voltage to the first bit line connected to the selected memory cell and specifying the word line connected to the memory cell, and data is read by supplying a read voltage to the first bit lines connected to the memory cell and specifying the word line connected to the memory cells.

4 Claims, 9 Drawing Sheets

MEMORY CELL ARRAY

BACKGROUND OF THE INVENTION

1. Field of the Invention

The present invention relates to a memory cell array.

2. Description of Related Art

Currently, further miniaturization of an electrical element is desired as a device is getting smaller and its density is increasing. As an example of such case, there has been known a switching element which can perform a switching operation by applying a voltage between two conductive bodies facing each other across a microscopic space (nanogap).

Specifically, for example, there has been developed a switching element which is composed of stable material of oxide silicon and gold, manufactured by a simple manufacturing method of oblique vapor deposition, and capable of repeating switching operation stably (for example, see Japanese Patent Application Laid-Open No. 2005-79335).

There has also been developed a switching element which can be arranged at a high density and its integration becomes easy by aligning two conductive bodies facing each other across a nanogap in vertical direction (for example, see Japanese Patent Application Laid-Open No. 2008-243986).

In order to apply such switching element (hereinafter referred to as "nanogap element") including the nanogap to a high-density memory, it is necessary to relate a "low resistance state" and "high resistance state" which corresponds to "ON" and "OFF" respectively to "zero (0)" and "one (1)" of the memory, and arranging nanogap elements in an array to construct a memory cell array.

Conventionally, as a memory cell array, there has been known a Dynamic Random Access Memory (DRAM) memory cell array (for example, see Japanese Patent Application Laid-Open No. 2000-269358).

A memory cell provided in the DRAM memory cell array includes, for example, a memory cell containing a metal-oxide semiconductor (MOS) transistor and a capacitor as shown in FIG. 9.

However, since the memory cell included in the DRAM memory cell array uses the capacitor as the memory element, there is a problem that it is difficult to further miniaturize the memory cell array or to increase its density.

SUMMARY OF THE INVENTION

It is an object of the present invention to provide a memory cell array which can be miniaturized, whose density can be increased, and which has a good consistency with an existing semiconductor manufacturing technique.

According to a first aspect of the invention, there is provided a memory cell array in which a plurality of memory cells are arranged in an array, the memory cell array including: a plurality of word lines respectively connected to the plurality of memory cells; a plurality of first bit lines respectively connected to the plurality of memory cells; and a plurality of second bit lines respectively connected to the plurality of memory cells, wherein each of the memory cells includes: a metal-oxide semiconductor (MOS) transistor; and a switching element which is formed inside a contact hole including a first electrode connected to a first diffusion layer of the MOS transistor, wherein the switching element includes: a first conductive layer; a second conductive layer provided above the first conductive layer; and a gap having a size of nanometer order which is formed between the first conductive layer and the second conductive layer, and in which gap a phenomenon that a resistance value is changed by application of a predetermined voltage between the first conductive layer and the second conductive layer occurs, wherein each of the word lines is connected to a gate electrode of the MOS transistor, wherein each of the first bit lines is connected to a second electrode connected to a second diffusion layer of the MOS transistor, wherein each of the second bit lines is connected to the second conductive layer, and wherein data is written in one or more selected memory cells among the memory cells by supplying a write voltage to one or more of the first bit lines connected to the one or more selected memory cells and specifying one or more of the word lines connected to the one or more selected memory cells, and data is read from one or more selected memory cells among the memory cells by supplying a read voltage to one or more of the first bit lines connected to the one or more selected memory cells and specifying one or more of the word lines connected to the one or more selected memory cells.

BRIEF DESCRIPTION OF THE DRAWINGS

The above and other objects, advantages and features of the present invention will become more fully understood from the detailed description given hereinbelow and the appended drawings which are given by way of illustration only, and thus are not intended as a definition of the limits of the present invention, and wherein.

DETAILED DESCRIPTION OF THE PREFERRED EMBODIMENTS

The best mode for carrying out the present invention will be explained below with reference to the drawings. The scope of the invention is not limited to illustrated examples.

First Embodiment

Firstly, a memory cell array 10 according to the first embodiment will be described.

Figure 1:
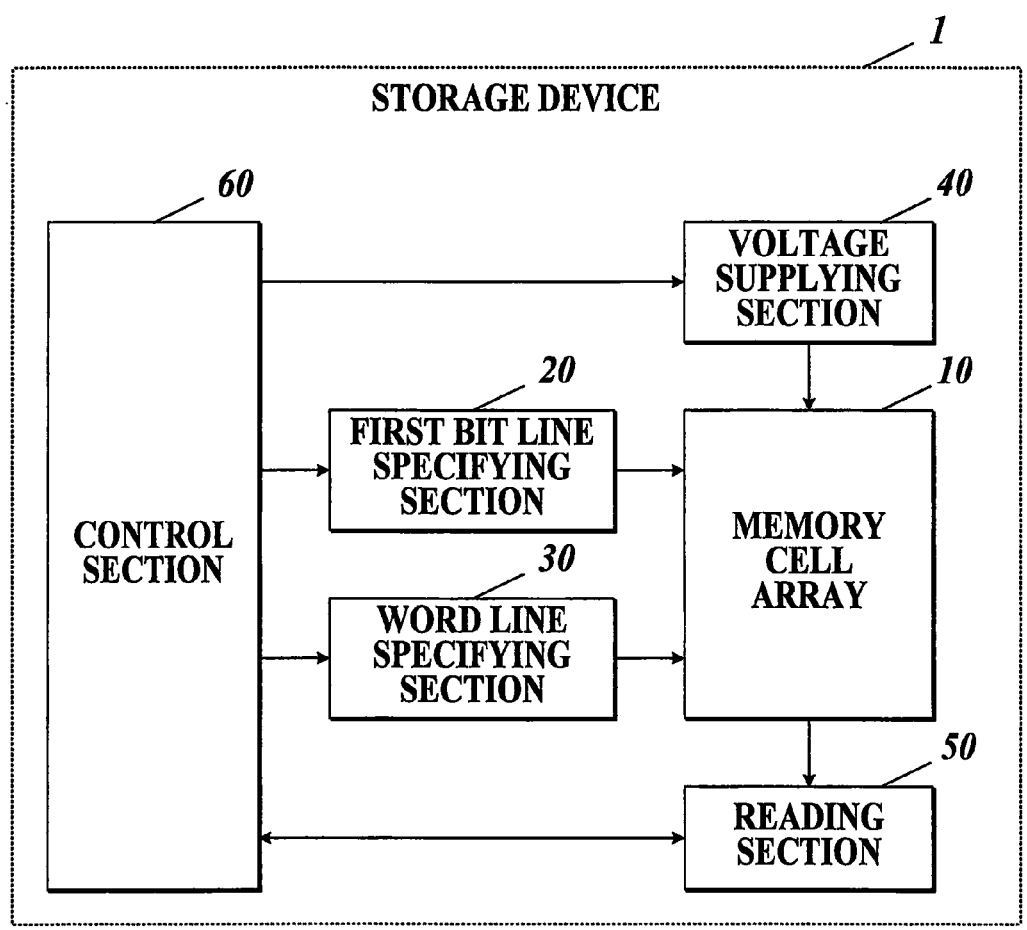
FIG. 1 is a block diagram showing an example of a functional configuration of a storage device equipped with a memory cell array according to a first embodiment.
Figure 2:
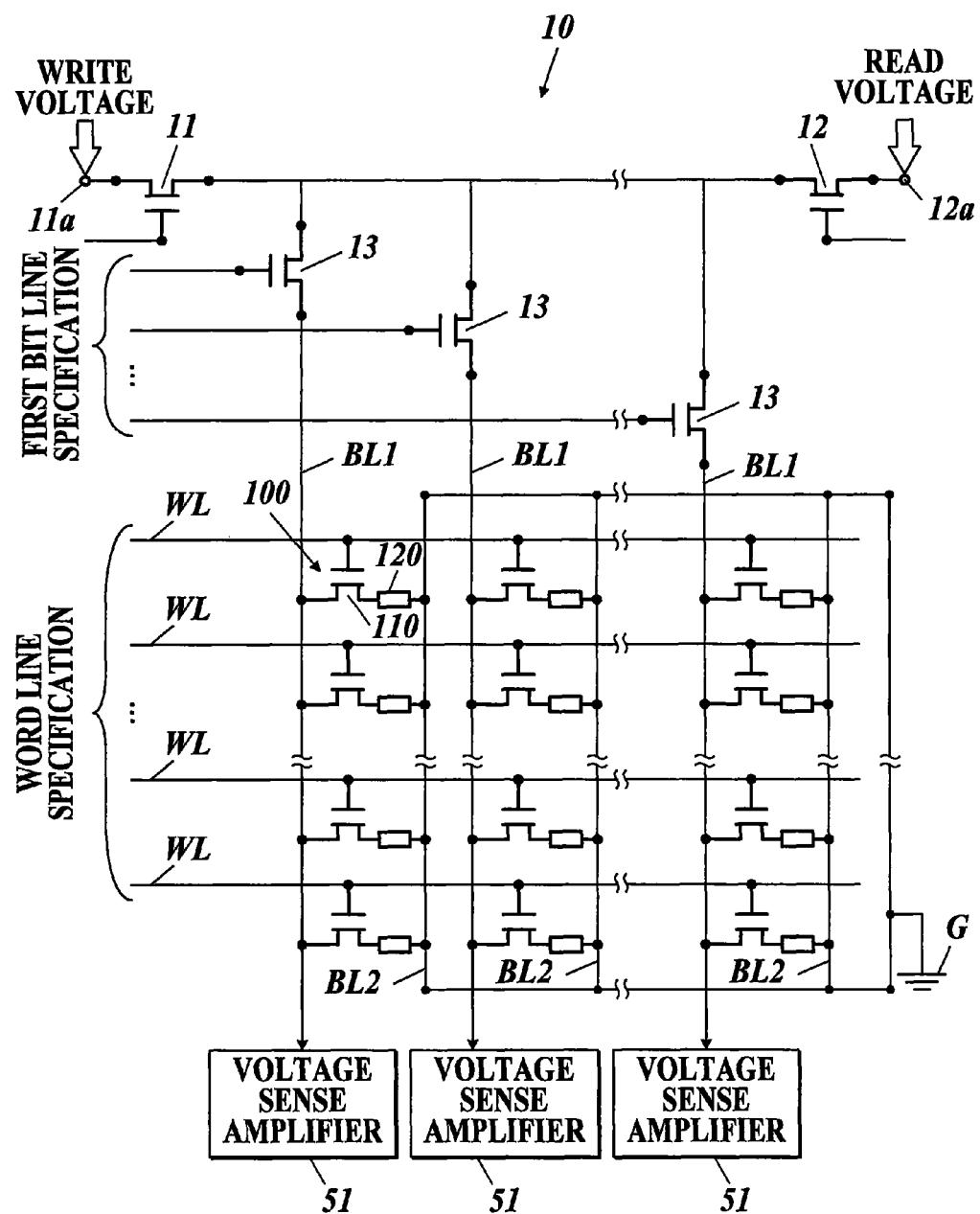
FIG. 2 is a circuit diagram showing an example of a configuration of main parts of the memory cell array according to the first embodiment.
Figure 3:
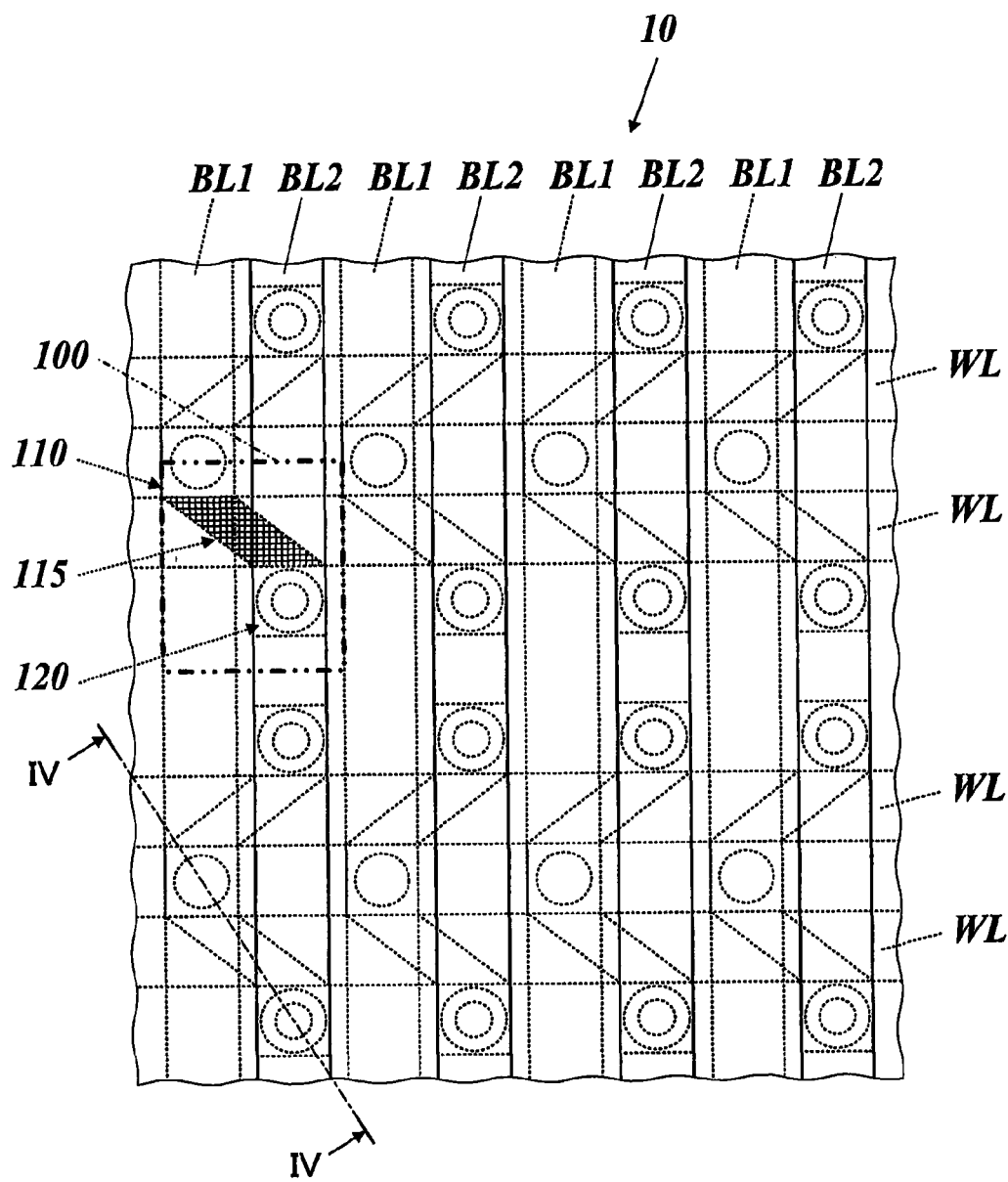
FIG. 3 is a plain diagram showing an example of a configuration of main parts of the memory cell array according to the first embodiment.
Figure 4:
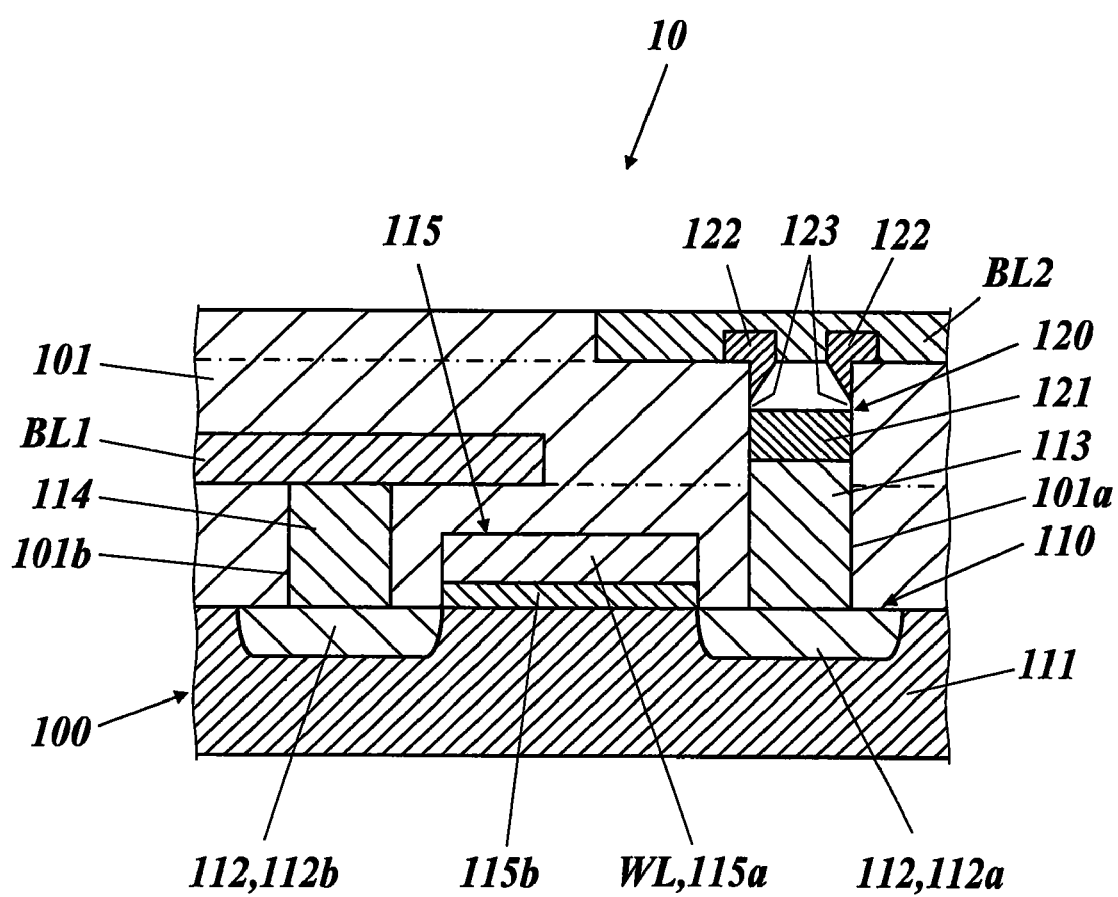
FIG. 4 is a cross-section diagram schematically showing an example of a cross-section along a line IV-IV of FIG. 3.

FIG. 1 is a block diagram showing an example of a functional configuration of a storage device 1 including the memory cell array 10. FIG. 2 is a circuit diagram showing an example of a configuration of main parts of the memory cell array 10, and FIG. 3 is a plain diagram showing an example of a configuration of main parts of the memory cell array 10. FIG. 4 is a cross-section diagram schematically showing an example of a cross-section along a line IV-IV of FIG. 3.

A region enclosed within a chain double-dashed line in FIG. 3 is one memory cell 100 among a plurality of memory cells 100 included in the memory cell array 10, and a shaded region in FIG. 3 is a gate region 115 of a MOS transistor 110 of one memory cell 100 among the plurality of memory cells 100 included in the memory cell array 10.
(Storage Device)

The storage device 1 is a nonvolatile semiconductor storage device (nonvolatile Random Access Memory (RAM)) capable of reading, writing and deleting data, which device is equipped with the memory cell array 10 where the plurality of memory cells 100 are arranged in an array.

Specifically, as shown in FIG. 1 for example, the storage device 1 is configured to include the memory cell array 10, a first bit line specifying section 20, a word line specifying section 30, a voltage supplying section 40, a reading section 50, a control section 60, and so on.
(Memory Cell Array)

The memory cell array 10 is, for example, a high density memory where the plurality of memory cells 100 are arranged in an array (for example, two-dimensional array).

For example, as shown in FIGS. 2-4, the memory cell array 10 is configured to include: the memory cells 100 each of which contains a MOS transistor 110 as a selection element and a nanogap element 120 as a memory element connected to the MOS transistor 110 in series; a plurality of word lines WL, a plurality of first bit lines BL1, and a plurality of second bit lines BL2, which are respectively connected to the plurality of memory cells 100; a first transistor 11 which functions as a switch connected to the plurality of first bit lines BL1; a second transistor 12 which functions as a switch connected to the plurality of first bit lines BL1; and a plurality of third transistors 13 which function as switches respectively connected to the plurality of first bit lines BL1, and so on.

In other words, each of the memory cells 100 included in the memory cell array 10 has a configuration where a capacitor of the memory cell included in the DRAM memory cell array is replaced with the nanogap element 120 as shown in FIG. 4 for example.

Figure 9:
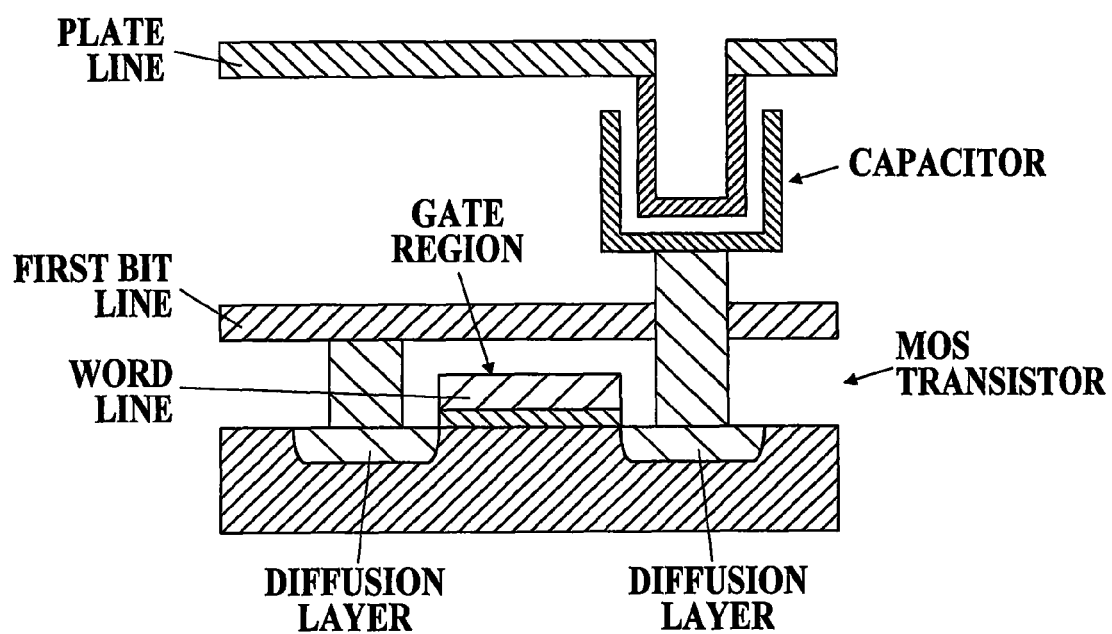
FIG. 9 is a diagram schematically showing an example of a cross-section of a conventional memory cell.

The nanogap element 120 is formed inside a contact hole 101a which includes a first electrode 113 connected to a first diffusion layer 112a of the MOS transistor 110. Since the memory element (the nanogap element 120) included in the memory cell array 10 is smaller than the memory element (capacitor) included in the DRAM memory cell array as shown in FIGS. 4 and 9 for example, the memory cell array 10 can be downsized more than the DRAM memory cell array.

A cell configuration of each of the memory cells 100 is $6F^2$ configuration of 3F×2F as shown in FIG. 3, for example. F is a value (namely, feature size) which gives an indication of minimum feature size used in a semiconductor device.

As shown in FIG. 4 for example, the MOS transistor 110 is configured to include: a semiconductor substrate 111; the diffusion layers 112, 112 which are formed on a surface of the semiconductor substrate 111 and have high impurity densities; the first electrode 113 (for example, metal electrode) which is provided inside the contact hole 101a formed in an insulation layer 101 and connected to the semiconductor substrate 111 through the first diffusion layer 112a; a second electrode 114 (for example, metal electrode) which is provided inside the contact hole 101b formed in the insulation layer 101 and connected to the semiconductor substrate 111 through the second diffusion layer 112b; the gate region 115 composed of a gate electrode 115a (for example, polysilicon electrode) and a gate insulation film 115b (for example, $SiO_2$ film) which is formed between the first diffusion layer 112a and a second diffusion layer 112b on the semiconductor substrate 111, and so on.

The nanogap element 120 is a memory element to switch a resistance status between nanogap electrodes (in a gap included in a gap section 123) to store data, for example.

The nanogap element 120 is formed on the first electrode 113 which is provided inside the contact hole 101a and on the first diffusion layer 112a of the MOS transistor 110, for example.

Specifically, as shown in FIG. 4 for example, the nanogap element 120 is configured to include: a first conductive body 121 provided on the first electrode 113; a second conductive body 122 provided above the first conductive body 121; the gap section 123 which is formed between the first conductive body 121 and the second conductive body 122 and which contains a gap having a size of nanometer order where a phenomenon that a resistance value is changed by application of a predetermined voltage between the first conductive body 121 and the second conductive body 122 occurs, and the like.

The shape of the first conductive body 121 is not specifically limited as long as the first conductive body 121 is connected to the first electrode 113. For example, as shown FIG. 4, the first conductive body 121 is formed so as to cover an upper surface of the first electrode 113.

The material of the first conductive body 121 is not especially limited, and preferably at least one selected from gold, silver, platinum, palladium, nickel, aluminum, cobalt, chrome, rhodium, copper, tungsten, tantalum, carbon, and alloy thereof, for example.

The shape of the second conductive body 122 is not specifically limited as long as the second conductive body 122 is provided above the first conductive body 121 and connected to each of the second bit lines BL2. For example, as shown in FIG. 4, the second conductive body 122 is formed within an area from a part of an inner wall of the contact hole 101a to an open edge section of the contact hole 101a.

The material of the second conductive body 122 is not specifically limited, and preferably at least one selected from gold, silver, platinum, palladium, nickel, aluminum, cobalt, chrome, rhodium, copper, tungsten, tantalum, carbon, and alloy thereof, for example.

Each of the word lines WL is formed in a line shape for example, and the word lines WL are arranged in parallel with one another on the semiconductor substrate 11, for example.

In this embodiment, the gate electrode 115a of the MOS transistor 110 also has a function of each of the word lines WL. In other words, each of the word lines WL is provided on the semiconductor substrate 111 via the gate insulation film 115b, and a part including portions of each of the word lines WL and the gate insulation film 115b between the first diffusion layer 112a and the second diffusion layer 112b is the gate region 115 of the MOS transistor 110. Thus, a predetermined region (a portion between the first diffusion layer 112a and the second diffusion layer 112b) of each of the word lines WL composes the gate region 115, and thereby each of the word lines WL is connected to the gate electrode 115a.

Each of the first bit lines BL1 is formed in a line shape at a position upper than each of the word lines WL for example, and the first bit lines BL1 are arranged in parallel with one another so as to be perpendicular to the word lines WL.

Each of the first bit lines BL1 is connected to the second electrode 114 which is connected to the second diffusion layer 112b of the MOS transistor 110, for example.

As shown in FIG. 2 for example, one end portions of the first bit lines BL1 are connected to a write voltage terminal 11a to which a write voltage is applied via the third transistors 13 and the first transistor 11, and connected to a read voltage terminal 12a to which a read voltage is applied via the third transistors 13 and the second transistor 12. The other end portions are respectively connected to voltage sense amplifiers 51 included in the reading section 50.

Each of the second bit lines BL2 is formed in a line shape at a position upper than each of the first bit lines BL1 for example, and the second bit lines BL2 are arranged in parallel to the first bit lines BL1 (namely, in parallel with one another) so as to be perpendicular to the word lines WL, for example.

Each of the second bit lines BL2 is connected to the second conductive body 122 of the nanogap element 120, for example.

As shown in FIG. 2 for example, both ends of each of the second bit lines BL2 are connected to a ground G.

Next, an example of a method for manufacturing the memory cell array 10 will be described.

The memory cell array 10 is manufactured by the steps of: (a) producing the semiconductor substrate 111 of the MOS transistor 110 on a substrate (not shown) of the memory cell array 10; (b) forming the diffusion layers 112a, 112b on the surface of the semiconductor substrate 111; (c) producing the gate insulation film 115b on the semiconductor substrate 111; (d) producing the word lines WL (the gate electrodes 115a) on the gate insulation film 115b; (e) producing the insulation film 101 (first insulation layer) which covers the semiconductor substrate 111 (including the diffusion layers 112a, 112b), the gate insulation film 115b and the word lines WL (gate electrodes 115a) on the semiconductor substrate 111; (f) forming the contact hole 101b in the first insulation layer; (g) producing the second electrode 114 on the second diffusion layer 112b and inside the contact hole 101b; (h) producing the first bit lines BL1 each of which is connected to the second electrode 114 on the first insulation layer; (i) producing the insulation layer 101 (second insulation layer) which covers the first insulation layer and the first bit lines BL1 on the first insulation layer; (j) forming the contact hole 101a in the first insulation layer and the second insulation layer; (k) producing the first electrode 113 on the first diffusion layer 112a and inside the contact hole 101a; (l) producing the first conductive body 121 of the nanogap element 120 on the first electrode 113 and inside the contact hole 101a; (m) producing the second conductive body 122 of the nanogap element 120 above the first conductive body 121; (n) producing the second bit lines BL2 each of which is connected to the second conductive body 122 on the second insulation layer; and (o) producing the insulation layer 101 (third insulation layer) on the second insulation layer, for example.

For producing patterns of the word lines WL, the first bit lines BL1, the second bit lines BL2, the conductive bodies (the first conductive body 121 and the second conductive body 122) of the nanogap element 120 and the like, optical lithography, electron beam lithography, dry etching, wet etching, liftoff, Chemical Vapor Deposition (CVD), Physical Vapor Deposition (PVD), Chemical Mechanical Polishing (CMP) and the like can be used, for example.

The above-mentioned method for manufacturing the memory cell array 10 is just one example, and the method of the present invention is not limited to the above.

(First Bit Line Specifying Section)

When address information concerning a location of one or more of first bit lines BL is input from the control section 60 for example, the first line specifying section 20 determines the one or more of first bit lines BL1 specified by the control section 60 based on the address information to specify the one or more of first bit lines BL1 by switching the third transistor 13 connected to the one or more first bit lines BL1 to ON state (conduction state).

(Word Line Specifying Section)

When the address information concerning a location of one or more word lines WL is input from the control section 60 for example, the word line specifying section 30 determines the one or more word lines WL specified by the control section 60 based on the address information to supply (apply) a predetermined voltage to the one or more word lines to specify the one or more word lines WL.

(Voltage Supplying Section)

When the control section 60 instructs to supply the write voltage for example, the voltage supplying section 40 switches the first transistor 11 included in the memory cell array 10 to ON state (conduction state) to supply (apply) the write voltage to the one or more first bit lines BL1.

Moreover, when the control section 60 instructs to supply the read voltage for example, the voltage supplying section 40 switches the second transistor 12 included in the memory cell array 10 to ON state (conduction state) to supply (apply) the read voltage to the one or more first bit lines BL1.

(Reading Section)

The reading section 50 contains the plurality (for example, the same number as that of the first bit lines BL1) of voltage sense amplifiers 51, for example.

When the control section 60 instructs to turn on one or more voltage sense amplifiers 51 for example, the reading section 50 turns on the one or more voltage sense amplifiers 51, and detects by the voltage sense amplifiers 51 the voltage of the one or more first bit lines BL1 connected to the one or more voltage sense amplifiers 51 to amplify the voltage. Then, the reading section 50 judges the data based on the amplified voltage to output the judgment result to the control section 60.

(Control Section)

The control section 60 is configured to include a Central Processing Unit (CPU), Read Only Memory (ROM), Random Access Memory (RAM), and the like for example, and performs a centralized control of each section of the storage device 1.

(Writing Processing)

Next, an example of processing concerning data writing to one or more memory cells 100 by the storage device 1 will be described.

The control section 60 writes the data in the one or more memory cells 100 by supplying the write voltage to the one or more first bit lines BL1 connected to one or more selected memory cells 100, and specifying the one or more word lines WL connected to the one or more memory cells 100.

Specifically, the control section 60 outputs the address information of the one or more first bit lines BL1 connected to the one or more selected memory cells 100 to the first bit line specifying section 20.

When the address information is input, the first bit line specifying section 20 switches the one or more third transistors 13 connected to the one or more first bit lines BL1 specified by the address information to ON state.

Then, the control section 60 outputs the address information of the one or more word lines WL connected to the one or more selected memory cells 100 to the word line specifying section 30.

When the address information is input, the word line specifying section 30 supplies a predetermined voltage to the one or more word lines WL specified by the address information.

Next, the control section 60 instructs the voltage supplying section 40 to supply the write voltage.

When it is instructed to supply the write voltage, the voltage supplying section 40 switches the first transistor 11 to ON state, and supplies the write voltage to the one or more first bit line BL1 via the write voltage terminal 11*a*.

Since the one or more first bit lines BL1 connected to the one or more memory cells 100 selected by the control section 60 are specified and the one or more word lines WL connected to the one or more selected memory cells 100 are specified, the MOS transistor 110 included in the one or more selected memory cells 100 is switched to ON state (conduction state). In this state, when the write voltage is supplied to the one or more first bit lines BL1, a potential difference occurs between the write voltage terminal 11*a* and the ground G via the one or more selected memory cells 100. Thus, the voltage is applied between the first conductive body 121 and the second conductive body 122 of the nanogap element 120 included in the one or more selected memory cells 100. As a result, a resistance state of the nanogap element 120 is switched from a low resistance state (for example, a resistance state corresponding to data "zero (0)") to a high resistance state (for example, a resistance state corresponding to data "one (1)") for example, and the data is written in the one or more selected memory cells 100 (the nanogap element 120).

Therefore, a voltage value of the write voltage needs to be a magnitude sufficient to switch the resistance state of the nanogap element 120. For example, the voltage value is 10V for switching to the high resistance state, and 7V for switching to the low resistance state.

(Reading Processing)

Next, an example of processing concerning data reading from the one or more memory cells 100 by the storage device 1 will be described.

The control section 60 supplies the read voltage to the one or more first bit lines BL1 connected to the one or more selected memory cells 100, and read the data from the one or more memory cells 100 by specifying the one or more word lines WL connected to the one or more memory cells 100.

Specifically, the control section 60 firstly outputs the address information of the one or more first bit lines BL1 connected to the one or more selected memory cells 100 to the bit line specifying section 20.

When the address information is input, the first bit line specifying section 20 switches the one or more third transistors 13 connected to the one or more first bit lines BL1 specified by the address information to ON state.

Then, the control section 60 instructs the voltage supplying section 40 to supply the read voltage.

When it is instructed to supply the read voltage, the voltage supplying section 40 switches the second transistor 12 to ON state, and supplies the read voltage to the one or more first bit lines BL1 through the read voltage terminal 12*a*.

Next, the control section 60 outputs the address information of the one or more word lines WL connected to the one or more selected memory cells 100 to the word line specifying section 30.

When the address information is input, the word line specifying section 30 supplies a predetermined voltage to the one or more word lines WL specified by the address information.

Next, the control section 60 instructs the reading section 50 to turn on the one or more voltage sense amplifiers 51.

Since the one or more first bit lines BL1 connected to the one or more memory cells 100 selected by the control section 60 is specified and the read voltage is supplied to the one or more first bit lines BL1, the read voltage is supplied to the specified first bit line BL1. In this state, when the one or more word lines WL connected to the one or more selected memory cells 100 is specified, the MOS transistor 110 included in the one or more selected memory cells 100 is switched to ON state (conduction state), a voltage depression depending on the resistance state of the nanogap element 120 included in the one or more selected memory cells 100 occurs in the one or more specified first bit line BL1. In other words, the voltage depression is large when the resistance state of the nanogap element 120 is the low resistance state, and the voltage depression is small when it is the high resistance state. Thus, by detecting the voltage of the one or more specified first bit line BL1 with the one or more voltage sense amplifier 51 to determine the resistance state of the nanogap element 120, the data ("zero (0)" or "one (1)") is read from the one or more selected memory cells 100 (the nanogap element 120).

Therefore, a voltage value of the read voltage is arbitrary as long as it is smaller than the voltage value of the write voltage so that the resistance state of the nanogap element 120 cannot be switched, for example, 2V and the like.

According to the above-described memory cell array 10 of the first embodiment, the plurality of memory cells 100 are arranged in an array, the plurality of word lines WL, the plurality of first bit lines BL1, and the plurality of second bit lines BL2 which are respectively connected to the plurality of memory cells 100 are provided, each of the memory cells 100 includes the MOS transistor 110 as the selection element and the nanogap element 120 as the memory element formed inside the contact hole 101*a* on the first diffusion layer 112*a* of the MOS transistor 110, the nanogap element 120 includes the first conductive body 121, the second conductive body 122 provided above the first conductive body 121, the gap having a size of nanometer order which is formed between the first conductive body 121 and the second conductive body 122 and in which the switching phenomenon of the resistance occurs by application of a predetermined voltage between the first conductive body 121 and the second conductive body 122, each of the word lines WL is connected to the gate electrode 115*a* of the MOS transistor 110, each of the first bit line BL1 is connected to the second electrode 114 which is connected to the second diffusion layer 112*b* of the MOS transistor 110, and connected to each of the voltage sense amplifiers 51, and each of the second bit lines BL2 is connected to the second conductive body 122 and the ground G. By supplying the write voltage to the one or more first bit lines BL1 connected to the one or more selected memory cells 110 and specifying the one or more word lines WL connected to the memory cells 100, the data is written in the memory cells 100, and by supplying the read voltage to the one or more first bit lines BL1 connected to the one or more selected memory cells 100 and specifying the one or more word lines WL connected to the memory cells 100, the data is read from the memory cells 100.

In other words, the memory cell array 10 has a configuration where a capacitor of a conventional memory cell array (DRAM memory cell array) is displaced with the nanogap element 120. The nanogap element 120 is suitable for a high-density configuration, because it is formed inside the contact hole 101*a*, smaller than the capacitor, and a vertical nanogap element 120 where the first conductive body 121 and the second conductive body 122 are arranged longitudinally (vertically) while the gap (the gap included in the gap section 123) having a size of nanometer order exists therebetween, in which gap the phenomenon (memory phenomenon of the resistance value) that the resistance value is changed occurs. Therefore, the memory cell array 10 can be downsized and its density can be increased, and conformity of the memory cell array 10 with an existing semiconductor technique is high.

Second Embodiment

Next, the memory cell array 10A according to the second embodiment will be described.

Figure 5:
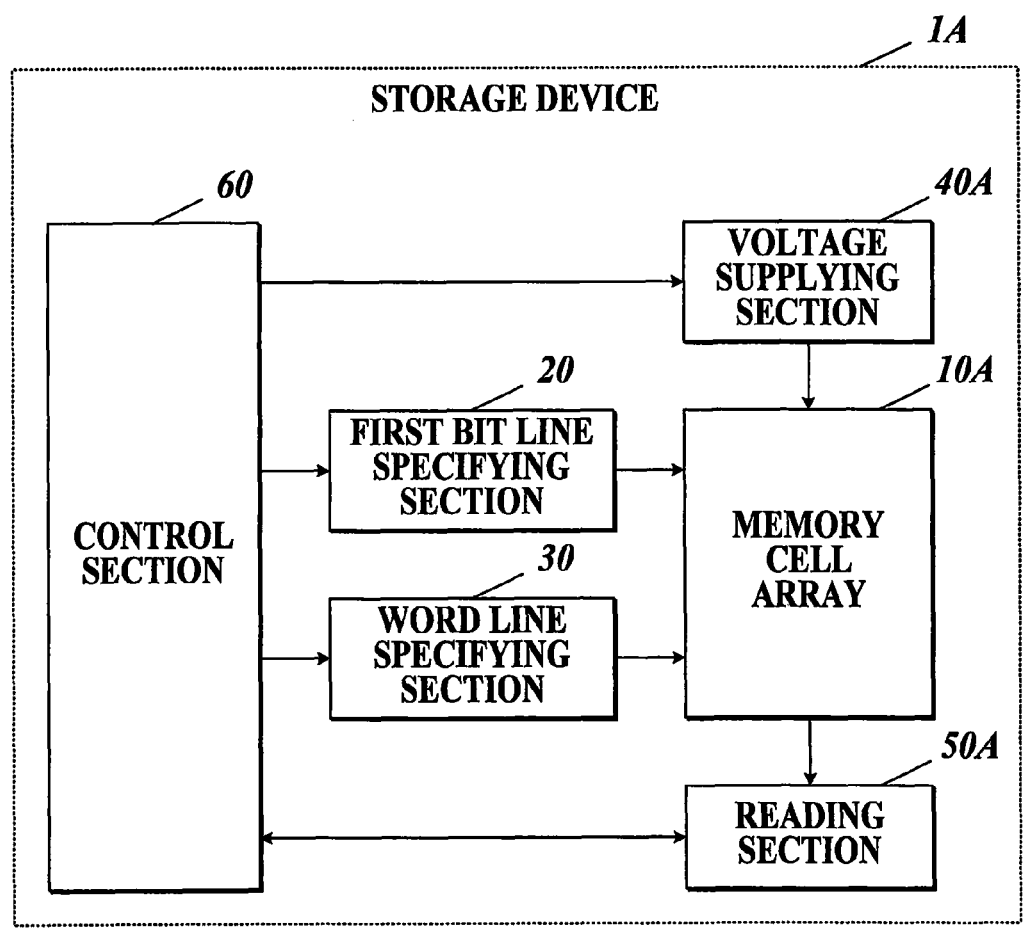
FIG. 5 is a block diagram showing an example of a functional configuration of a storage device equipped with a memory cell array according to a second embodiment.
Figure 6:
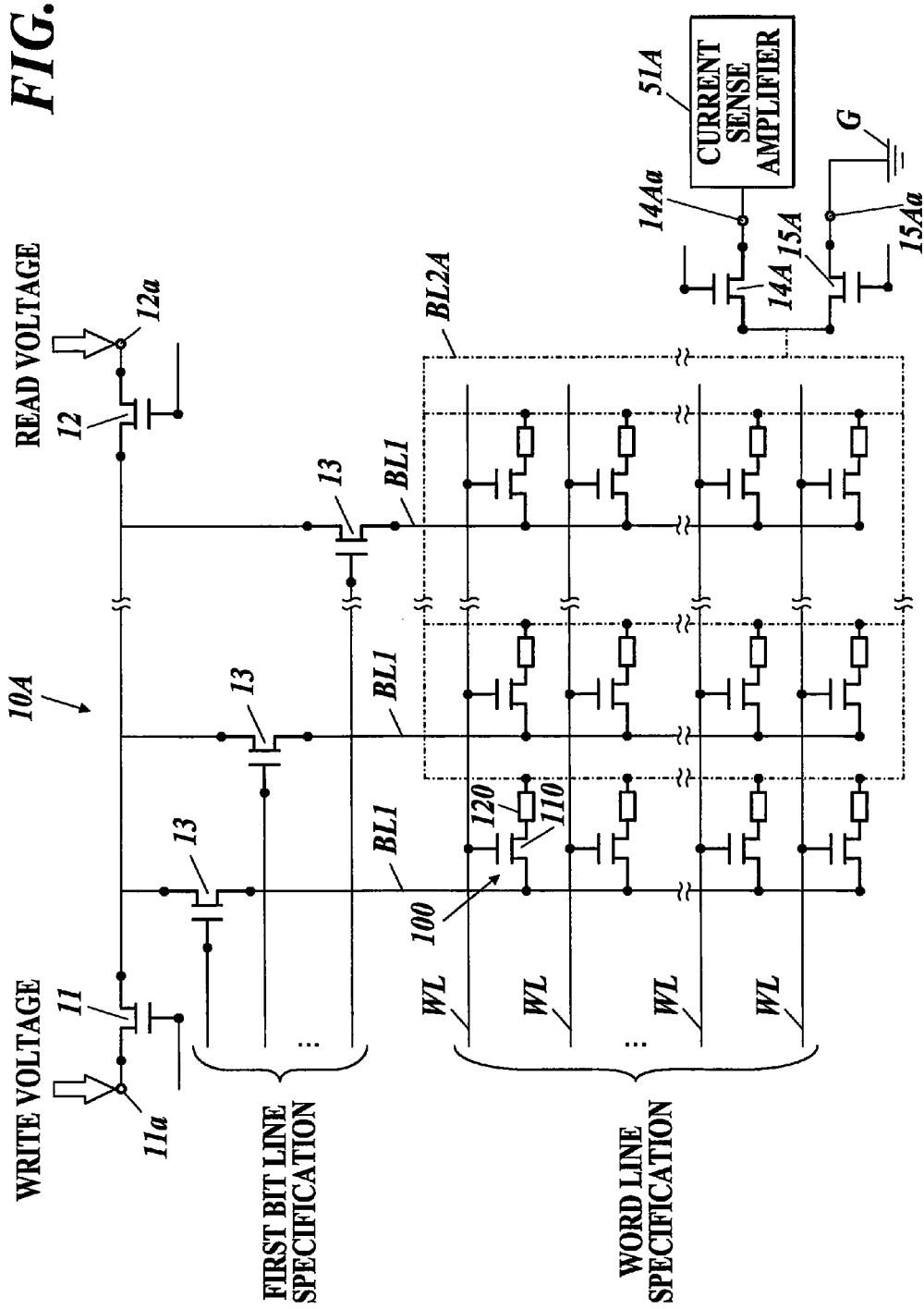
FIG. 6 is a circuit diagram showing an example of a configuration of main parts of the memory cell array according to the second embodiment.
Figure 7:
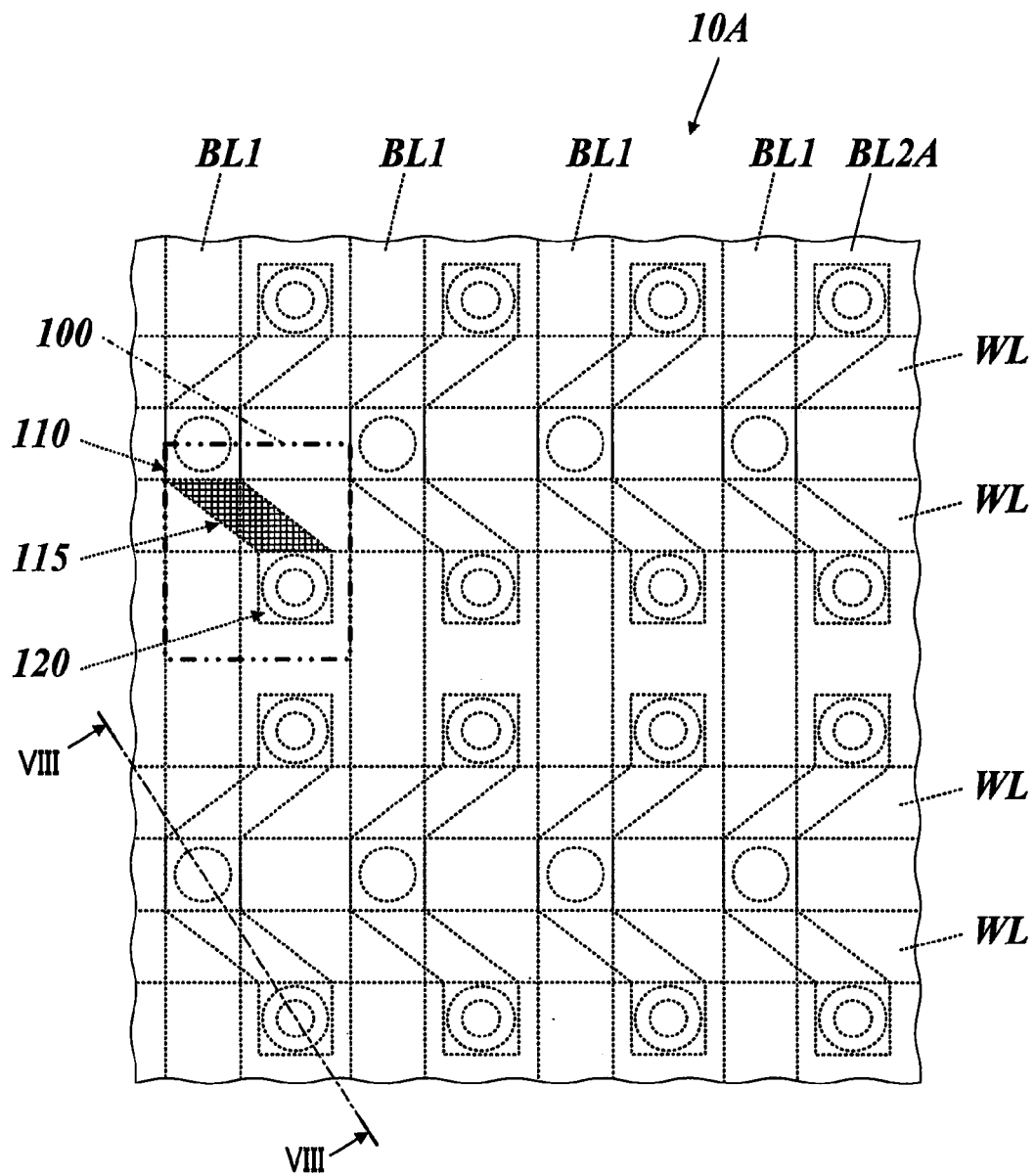
FIG. 7 is a plain diagram showing an example of a configuration of main parts of the memory cell array according to the second embodiment.
Figure 8:
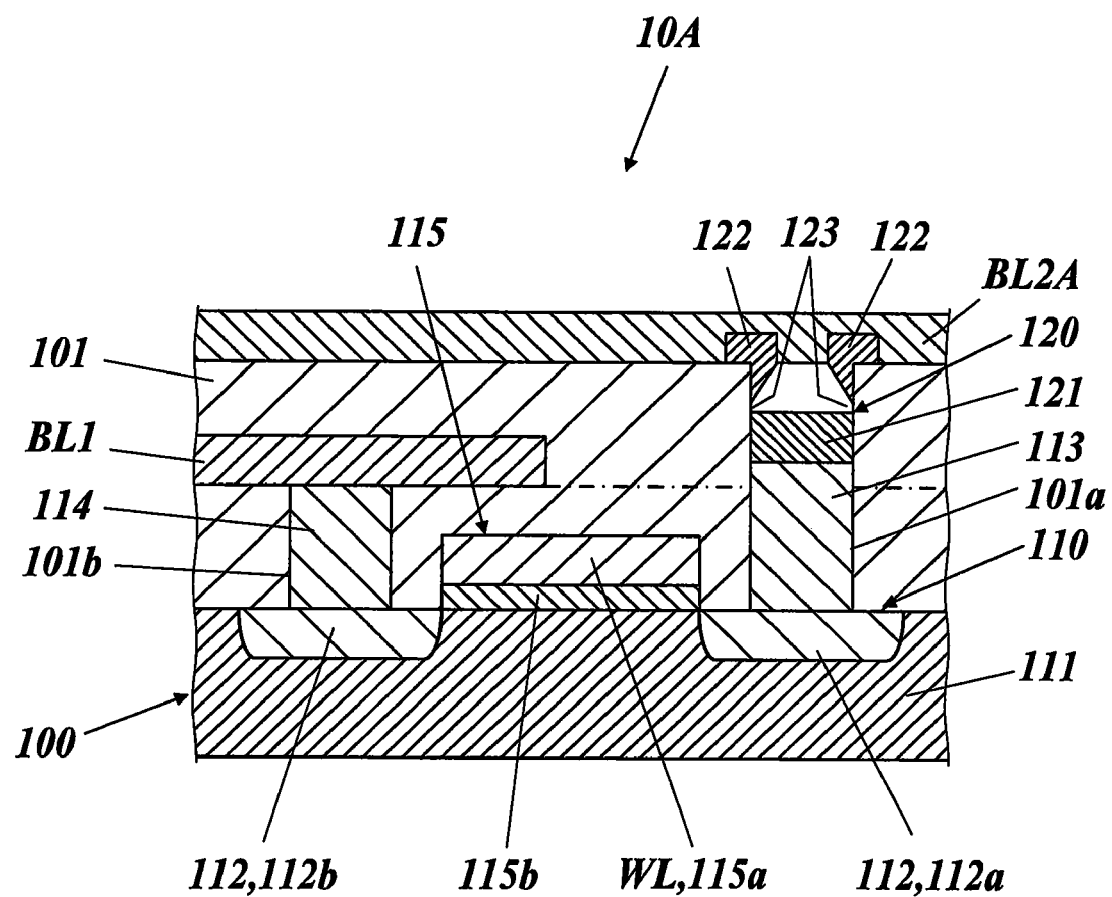
FIG. 8 is a cross-section diagram schematically showing an example of a cross-section along a line VIII-VIII of FIG. 7.

FIG. 5 is a block diagram showing an example of a functional configuration of a storage device 1A provided with the memory cell array 10A. FIG. 6 is a circuit diagram showing an example of a configuration of main parts of the memory cell array 10A, FIG. 7 is a plain diagram showing an example of a configuration of main parts of the memory cell array 10A, and FIG. 8 is a cross-section diagram schematically showing an example of a cross-section along a line VIII-VIII of FIG. 7.

Incidentally, the memory cell array 10A of the second embodiment is different from the memory cell array 10 of the first embodiment in the point that the memory cell array 10A is connected to a current sense amplifier 51A instead of the voltage sense amplifiers 51 and provided with a planar second bit line BL2A instead of the linear bit lines BL2. Thus, only different points will be described, and detailed descriptions of other common parts are omitted by putting same reference numbers.

The second bit line BL2A is formed in a plane shape where the second bit lines BL2 of the first embodiment are connected with one another, for example. Specifically, as shown in FIGS. 7 and 8 for example, the second bit line BL2A covers an approximately whole upper surface of the insulation layer 101 (second insulation layer) and is connected to the second conductive body 122 of the nanogap element 120. In other word, an approximately whole upper surface of the memory cell array 10A is formed of the second bit line BL2A, for example.

Incidentally, since the second bit line BL2A is not formed into a line shape, the second bit line BL2A is shown by a virtual line (dashed line) in FIG. 6.

One end of the second bit line BL2A is, as shown in FIG. 6 for example, connected to the current sense amplifier 51A through a fourth transistor 14A which functions as a switch, and connected to the ground G through a fifth transistor 15A which functions as a switch.

Thus, since the second bit line BL2A is connected to the sense amplifier (the current sense amplifier 51A) in the second embodiment, the first bit lines BL1 are not connected to the sense amplifier (the voltage sense amplifier 51).

In other words, when supplying the write voltage to the one or more first bit lines BL1, the second bit line BL2A is connected to the ground G through a ground terminal 15Aa, and when supplying the read voltage to the one or more first bit lines BL1, the second bit line BL2A is connected to the current sense amplifier 51A through an amplifier terminal 14aA.

(Voltage Supplying Section)

When the control section 60 instructs to supply the write voltage for example, the voltage supplying section 40A switches the first transistor 11 and the fifth transistor 15A which are provided in the memory cell array 10A to ON state (conduction state) to supply (apply) the write voltage to the one or more first bit lines BL1.

Moreover, when the control section 60 instructs to supply the read voltage for example, the voltage supplying section 40A switches the second transistor 12 and the fourth transistor 14A which are provided in the memory cell array 10A to ON state (conduction state) to supply (apply) the read voltage to the one or more first bit lines BL1.

(Reading Section)

The reading section 50A contains one current sense amplifier 51A, for example.

When the control section 60 instructs to turn on the current sense amplifier 51A for example, the reading section 50A turns on the current sense amplifier 51A, and detects the current from the one or more second bit lines BL2A by the current sense amplifier 51A to amplify the current. Then, the reading section 50A judges the data based on the amplified current to output the judgment result to the control section 60.

(Writing Processing)

Next, an example of processing concerning data writing to the one or more memory cells 100 by the storage device 1A will be described.

The control section 60 writes the data to the one or more memory cells 100 by supplying the write voltage to the one or more first bit lines BL1 connected to the one or more selected memory cells 100 and specifying the one or more word lines WL connected to the one or more memory cells 100.

Specifically, the control section 60 firstly outputs the address information of the one or more first bit lines BL1 connected to the one or more selected memory cells 100 to the first bit line specifying section 20.

When the address information is input, the first bit line specifying section 20 switches the one or more third transistors 13 connected to the one or more first bit lines BL1 specified by the address information to ON state.

Then, the control section 60 outputs the address information of the one or more word lines WL connected to the one or more selected memory cells 100 to the word line specifying section 30.

When the address information is input, the word line specifying section 30 supplies a predetermined voltage to the one or more word lines WL specified by the address information.

Next, the control section 60 instructs the voltage supplying section 40A to supply the write voltage.

When it is instructed to supply the write voltage, the voltage supplying section 40A switches the first transistor 11 and the fifth transistor 15A to ON states, and supplies the write voltage to the one or more first bit lines BL1 through the write voltage terminal 11a.

Since the control section 60 specifies the one or more first bit lines BL1 connected to the one or more selected memory cells 100, and specifies the one or more word lines WL connected to the one or more selected memory cells 100, the MOS transistor 110 included in the one or more selected memory cells 100 is switched to ON state (conduction state). In this state, when the write voltage is supplied to the one or more first bit lines BL1, a potential difference occurs between the write voltage terminal 11a and the ground G across the one or more selected memory cells 100. Thus, the voltage is applied between the first conductive body 121 and the second conductive body 122 of the nanogap element 120 included in the one or more selected memory cells 100, and thereby the resistance state of the nanogap element 120 is switched from the low resistance state (for example, the resistance state corresponding to data "zero (0)") to the high resistance state (for example, the resistance state corresponding to data "one (1)") for example, and the data is written in the one or more selected memory cells 100 (the nanogap element 120).

Therefore, the voltage value of the write voltage needs to be a magnitude sufficient to switch the resistance state of the nanogap element 120. For example, the voltage is 10V for the high resistance state, and 7V for the low resistance state.

(Reading Processing)

Next, an example of processing concerning data reading from the one or more memory cells 100 by the storage device 1A will be described.

The control section 60 reads the data from the one or more memory cells 100 by supplying the read voltage to the one or more first bit lines BL1 connected to the one or more selected memory cells 100 and specifying the one or more word lines WL connected to the one or more memory cells 100.

Specifically, the control section 60 firstly outputs the address information of the one or more first bit lines BL1 connected to the one or more selected memory cells 100 to the first but line specifying section 20.

When the address information is input, the first bit line specifying section 20 switches the one or more third transistors 13 connected to the one or more first bit lines BL1 specified by the address information to ON state.

Then, the control section 60 instructs the voltage supplying section 40A to supply the read voltage.

When it is instructed to supply the read voltage, the voltage supplying section 40A switches the second transistor 14 and the fourth transistor 14A to ON state to supply the read voltage to the one or more first bit lines BL1 through the voltage terminal 12a.

Next, the control section 60 outputs the address information of the one or more word lines WL connected to the one or more selected memory cells 100 to the word line specifying section 30.

When the address information is input, the word line specifying section 30 supplies a predetermined voltage to the one or more word lines WL specified by the address information.

Next, the control section 60 instructs the reading section 50A to turn on the current sense amplifier 51A.

Since the control section 60 specifies the one or more first bit lines BL1 connected to the one or more selected memory cells 100 and the read voltage is supplied to the one or more first but lines BL1, the read voltage is supplied to the one or more specified first bit line BL1. In this state, when the one or more word line WL connected to the one or more selected memory cells 100 is specified, the MOS transistor 100 included in the one or more selected memory cells 100 is switched to ON state (conduction state), and the current depending on the resistance state of the nanogap element 120 included in the one or more selected memory cells 100 flows from the read voltage terminal 12a to the current sense amplifier 51A through the selected memory cells 100. In other words, the current having a high current value flows when the resistance state of the nanogap element 120 is the low resistance state, and the current having a low current value flows in the high resistance state. Thus, by detecting the current from the one or more second bit lines BL2A with the current sense amplifier 51A to judge the resistance state of the nanogap element 120, the data ("zero (0)" or "one (1)") is read from the one or more selected memory cells 100 (the nanogap element 120).

Therefore, the voltage value of the read voltage is arbitrary as long as the value is smaller than the write voltage and has a magnitude which disables switching of the resistance state of the nanogap element 120, for example, 2V.

According to the memory cell array 10A of the second embodiment, needless to say the advantage same as that of the memory cell array 10 the first embodiment can be obtained, and in addition the second bit line BL2A is formed in a plain shape, connected to the ground G via the ground terminal 15Aa when the write voltage is supplied to the one or more first bit lines BL1, and connected to the current sense amplifier 51A via the amplifier terminal 14Aa when the read voltage is supplied to the one or more first bit lines BL1.

In other words, the number of the connected sense amplifier is one (1). Thus, since the number of the sense amplifiers is reduced in comparison with the conventional memory cell array (DRAM memory cell array) or the memory cell array 10 of the first embodiment, costs for manufacturing the storage device 1 provided with the memory cell array 10A can be reduced.

Incidentally, the present invention is not limited to the above-described embodiment, and can be appropriately changed without departing from the spirit of the present invention.

Though the cell configuration of each of the memory cells 100 is $6F^2$ configuration in the first and second embodiments, the cell configuration is not limited to the above, and can be appropriately changed as someone thinks proper.

Although the gate electrode 115a of the MOS transistor 110 functions also as each of the word lines WL in the first and second embodiments, the configuration is not limited to the above, and the gate electrode 115a and each of the word lines WL may be separately formed, for example.

Moreover, though each of the second bit lines BL2, BL2A is formed separately from the second conductive body 122 of the nanogap element 120 in the first and second embodiment, the configuration is not limited to the above, and they may be formed integrally so that the second conductive body 122 also functions as each of the second bit lines BL2, BL2A.

In the first embodiment, though each of the second bit lines BL2 has a line shape, the configuration is not limited to the above as long as each of the second bit line BL2 is connected to the ground G, and it may has a plain shape where at least two second bit lines BL2 among the plurality of second bit lines BL2 are connected to each other like the second bit lines BL2A of the second embodiment, for example.

Furthermore, though the first embodiment adopts the configuration where all of the end portions of the second bit lines BL2 join (are connected to) one another as shown in FIG. 2 for example, the configuration is not limited to the above as long as the second bit lines BL2 are connected to the ground G. For example, a configuration where each of the second bit lines BL2 has an independent shape, or a shape where at least two second bit lines BL2 among the plurality of second bit lines BL2 join (are connected to) one another may be adopted.

In the second embodiment, though the second bit line BL2A has the plain shape where all of the plurality of the second bit lines BL2 of the first embodiment are connected to one another, the shape of the second bit line BL2A is arbitrary as long as it is a plain shape where at least two second bit lines BL2 among the plurality of second bit lines BL2 of the first embodiment are connected to each other.

Moreover, in the second embodiment, though the second bit line BL2A has the plain shape, the shape is not limited to the above, and it may be a line shape similar to each of the first bit lines BL2 of the first embodiment. When forming each of the second bit lines BL2A into a line shape, a configuration where each of the second bit lines BL2A has an independent shape, and each line BL2A is connected to the current sense amplifier 51A through the fourth transistor 14A and connected to the ground terminal 15aA (ground G) through the fifth transistor 15A may be adopted, and a configuration where end portions of at least two second bit lines BL2A among a plurality of second bit lines BL2A join (are connected to) one another and the joined portions are connected to the current sense amplifier 51A through the fourth transistor 14A and connected to the ground terminal 15aA (ground G) through the fifth transistor 15A may be adopted.

In the first embodiment, though the first bit lines BL1 included in the memory cell array 10 are connected to the voltage sense amplifiers 51 of the same numbers as the first bit lines BL1, the configuration is not limited to the above, and a configuration where end portions on the voltage sense amplifier 51 side of at least two first bit lines BL1 among the plurality of first bit lines BL1 join one another, and the joined end portions are connected to the voltage sense amplifier 51 may be adopted, for example.

Moreover, in the second embodiment, though the number of each of the fourth transistor 14A, the current sense amplifier 51A, and the fifth transistor 15A which are connected to the memory cell array 10A is one (1) because the memory cell array 10A has one second bit line BL2A, the number of each of the fourth transistor 14A, the current sense amplifier 51A, and the fifth transistor 15A may be appropriately changed depending on the number of the second bit lines BL2A included in the memory cell array 10A as someone thinks proper. When the memory cell array 10A is provided with a plurality of second bit lines BL2A for example, a configuration where end portions of at least two second bit lines BL2A among the plurality of second bit lines BL2A join one another, and the joined end portions are connected to the current sense amplifier 51A through the fourth transistor 14A and connected to the ground terminal 15Aa (ground G) through the fifth transistor 15A may be adopted.

In the first and second embodiments, through the resistance states of the nanogap element 120 are distributed into the "high resistance state" and the "low resistance state" and one memory cell 100 stores the binary data, the resistance states of the nanogap element 120 can be distributed also into three or more states depending on a magnitude of the value of the voltage applied between the first conduction body 121 and the second conduction body 122 of the nanogap element 120. Therefore, in the memory cell array 10 of the present invention, by adjusting the voltage value of the write voltage to be supplied, one memory cell 100 can store multiple-valued data.

As described above, according to the present embodiment, there is provided a memory cell array in which a plurality of memory cells are arranged in an array, the memory cell array including: a plurality of word lines respectively connected to the plurality of memory cells; a plurality of first bit lines respectively connected to the plurality of memory cells; and a plurality of second bit lines respectively connected to the plurality of memory cells, wherein each of the memory cells includes: a metal-oxide semiconductor (MOS) transistor; and a switching element which is formed inside a contact hole including a first electrode connected to a first diffusion layer of the MOS transistor, wherein the switching element includes: a first conductive layer; a second conductive layer provided above the first conductive layer; and a gap having a size of nanometer order which is formed between the first conductive layer and the second conductive layer, and in which gap a phenomenon that a resistance value is changed by application of a predetermined voltage between the first conductive layer and the second conductive layer occurs, wherein each of the word lines is connected to a gate electrode of the MOS transistor, wherein each of the first bit lines is connected to a second electrode connected to a second diffusion layer of the MOS transistor, wherein each of the second bit lines is connected to the second conductive layer, and wherein data is written in one or more selected memory cells among the memory cells by supplying a write voltage to one or more of the first bit lines connected to the one or more selected memory cells and specifying one or more of the word lines connected to the one or more selected memory cells, and data is read from one or more selected memory cells among the memory cells by supplying a read voltage to one or more of the first bit lines connected to the one or more selected memory cells and specifying one or more of the word lines connected to the one or more selected memory cells.

Preferably, the first bit lines are respectively connected to voltage sense amplifiers, and the second bit lines are connected to a ground.

Preferably, the second bit lines are connected to a ground when the write voltage is supplied to the one or more first bit lines, and the second bit lines are connected to a current sense amplifier when the read voltage is supplied to the one or more first bit lines.

Preferably, at least two second bit lines among the plurality of second bit lines join each other, and the joined second bit lines are connected to the ground through a ground terminal when the write voltage is supplied to the one or more first bit lines, and the joined second bit lines are connected to the current sense amplifier when the read voltage is supplied to the one or more first bit lines.

According to the present invention, in the memory cell array where the plurality of memory cells are arranged in an array, the plurality of word lines connected to the plurality of memory cells, the plurality of first bit lines, and the plurality of second bit lines which are respectively connected to the plurality of memory cells are provided, and the memory cell is provided with the MOS transistor and the nanogap element which is formed inside the contact hole including the first electrode connected to the first diffusion layer of the MOS transistor, the nanogap element includes the first conductive body, the second conduct body provided above the first conductive body, and the gap which is formed between the first conductive body and the second conductive body and in which the phenomenon that the resistance value is changed by application of a predetermined voltage between the first conductive body and the second conductive body occurs, each of the word lines is connected to the gate electrode of the MOS transistor, each of the first bit lines is connected to the second electrode connected to the second diffusion layer of the MOS transistor, each of the second bit lines is connected to the second conductive body, and by supplying the write voltage to the one or more first bit lines connected to the one or more selected memory cells and specifying the one or more word lines connected to the memory cells, the data is written to the memory cells, and by supplying the read voltage to the one or more first bit lines connected to the one or more selected memory cells and specifying the one or more word lines connected to the one or more memory cells, the data is read from the memory cells.

In other words, the memory cell array of the present invention has a configuration where a capacitor of a conventional memory cell array (DRAM memory cell array) is displaced with the nanogap element. Since the nanogap element is formed inside the contact hole and smaller than the capacitor, and suitable for a high-density configuration because it is a nanogap element where the first conductive body and the second conductive body are arranged longitudinally, while the gap having a size of nanometer order exists therebetween, in which gap the phenomenon that the resistance value is changed occurs. Therefore, the memory cell array can be downsized and its density can be increased, and it becomes possible to provide a memory cell array capable of conforming to an existing semiconductor technique.

The entire disclosure of Japanese Patent Application No. 2008-334122 filed on Dec. 26, 2008 including description, claims, drawings, and abstract are incorporated herein by reference in its entirety.

What is claimed is:

1. A memory cell array in which a plurality of memory cells are arranged in an array, the memory cell array comprising:
a plurality of word lines respectively connected to the plurality of memory cells;

a plurality of first bit lines respectively connected to the plurality of memory cells; and a plurality of second bit lines respectively connected to the plurality of memory cells, wherein each of the memory cells includes:
  a metal-oxide semiconductor (MOS) transistor; and
  a switching element which is formed inside a contact hole including a first electrode connected to a first diffusion layer of the MOS transistor, wherein the switching element includes:
  a first conductive layer;
  a second conductive layer provided above the first conductive layer; and
  a gap having a size of nanometer order which is formed between the first conductive layer and the second conductive layer, and in which gap a phenomenon that a resistance value is changed by application of a predetermined voltage between the first conductive layer and the second conductive layer occurs, wherein each of the word lines is connected to a gate electrode of the MOS transistor, wherein each of the first bit lines is connected to a second electrode connected to a second diffusion layer of the MOS transistor, wherein each of the second bit lines is connected to the second conductive layer, and wherein data is written in one or more selected memory cells among the memory cells by supplying a write voltage to one or more of the first bit lines connected to the one or more selected memory cells and specifying one or more of the word lines connected to the one or more selected memory cells, and data is read from one or more selected memory cells among the memory cells by supplying a read voltage to one or more of the first bit lines connected to the one or more selected memory cells and specifying one or more of the word lines connected to the one or more selected memory cells.

2. The memory cell array according to claim 1,
wherein the first bit lines are respectively connected to voltage sense amplifiers, and
wherein the second bit lines are connected to a ground.

3. The memory cell array according to claim 1,
wherein the second bit lines are connected to a ground when the write voltage is supplied to the one or more first bit lines, and the second bit lines are connected to a current sense amplifier when the read voltage is supplied to the one or more first bit lines.

4. The memory cell array according to claim 3,
wherein at least two second bit lines among the plurality of second bit lines join each other, and
wherein the joined second bit lines are connected to the ground through a ground terminal when the write voltage is supplied to the one or more first bit lines, and the joined second bit lines are connected to the current sense amplifier when the read voltage is supplied to the one or more first bit lines.

* * * * *